US011335597B2

(12) United States Patent
Dentoni Litta et al.

(10) Patent No.: US 11,335,597 B2
(45) Date of Patent: May 17, 2022

(54) METHOD FOR FORMING A BURIED METAL LINE

(71) Applicant: IMEC VZW, Leuven (BE)

(72) Inventors: Eugenio Dentoni Litta, Leuven (BE); Anshul Gupta, Leuven (BE); Julien Ryckaert, Schaerbeek (BE); Boon Teik Chan, Wilsele (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/945,858

(22) Filed: Aug. 1, 2020

(65) Prior Publication Data
US 2021/0035860 A1 Feb. 4, 2021

(30) Foreign Application Priority Data
Aug. 2, 2019 (EP) .................................... 19189796

(51) Int. Cl.
*H01L 21/768* (2006.01)
*H01L 21/306* (2006.01)
*H01L 21/3065* (2006.01)
*H01L 21/8234* (2006.01)

(52) U.S. Cl.
CPC .... *H01L 21/76885* (2013.01); *H01L 21/3065* (2013.01); *H01L 21/30604* (2013.01); *H01L 21/76831* (2013.01); *H01L 21/76879* (2013.01); *H01L 21/823475* (2013.01)

(58) Field of Classification Search
CPC ......... H01L 21/76885; H01L 21/30604; H01L 21/3065; H01L 21/76831; H01L 21/76879; H01L 21/823475
See application file for complete search history.

(56) References Cited

U.S. PATENT DOCUMENTS

| 6,476,444 B1* | 11/2002 | Min ................... H01L 29/66621 257/330 |
| 2007/0246783 A1 | 10/2007 | Moon et al. |
| 2009/0020798 A1* | 1/2009 | Lee ................... H01L 27/10841 257/303 |
| 2009/0230466 A1 | 9/2009 | Kim |
| 2010/0096693 A1 | 4/2010 | Hong |
| 2010/0308466 A1 | 12/2010 | Takesako |
| 2014/0061745 A1 | 3/2014 | Myung et al. |
| 2018/0294267 A1 | 10/2018 | Licausi et al. |

OTHER PUBLICATIONS

Extended European Search Report, EP Application No. 19189796.6, dated Feb. 12, 2020, 7 pages.

* cited by examiner

*Primary Examiner* — Dale E Page
*Assistant Examiner* — Quovaunda Jefferson
(74) *Attorney, Agent, or Firm* — McDonnell Boehnen Hulbert & Berghoff LLP (57) ABSTRACT

A method for forming a buried metal line in a substrate includes forming, at a position between a pair of semiconductor structures protruding from the substrate, a metal line trench in the substrate at a level below a base of each semiconductor structure of the pair. Forming the metal line trench includes etching an upper trench portion in the substrate, forming a spacer on sidewall surfaces of the upper trench portion that expose a bottom surface of the upper trench portion, and, while the spacer masks the sidewall surfaces, etching a lower trench portion by etching the substrate via the upper trench portion such that a width of the lower trench portion exceeds a width of the upper trench portion. The method further includes forming the metal line in the metal line trench.

20 Claims, 4 Drawing Sheets

METHOD FOR FORMING A BURIED METAL LINE

CROSS-REFERENCE TO RELATED APPLICATIONS

The present application is a non-provisional patent application claiming priority to European Patent Application No. 19189796.6, filed Aug. 2, 2019, the contents of which are hereby incorporated by reference in their entirety.

FIELD OF THE DISCLOSURE

This application is directed to a method for forming a buried metal line.

BACKGROUND

Integrated circuits typically comprise power rails (e.g., for VSS and VDD supply voltage distribution). Conventionally, power rails are encapsulated within a back-end-of-line (BEOL) interconnect structure located above the level of the active physical devices (e.g., transistors). In contrast, a "buried" power rail (BPR) is at least partly lowered into the substrate, such that the power rail may be located at a level below the active physical devices. Burying power rails facilitates increasing the cross-section of the power rails (e.g., for reduced line resistance) without occupying valuable space in the BEOL interconnect structure, which can be used for other purposes (e.g., signal lines). As an example, in the context of finFET technology, BPR formation may involve etching trenches in the substrate at positions between pairs of adjacent fins. The trenches may subsequently be filled with metal to form the BPRs.

SUMMARY

It is envisaged that use of the BPR will be challenging in future smaller technology nodes, since it may be difficult to maintain a sufficiently low line resistance when the BPR line width, the critical dimension, CD, of the BPR, is reduced. The effect of the reduced BPR CD on line resistance may be offset to an extent by using metals that have lower resistance and/or by increasing the depth of the BPR trenches and correspondingly the height of the BPRs. However, the available space for metal fill is already small when the BPR CD is scaled to 24 nm or less and increased trench depths are associated with a corresponding increase of trench aspect ratio, which eventually may make trench etching and also trench filling more challenging.

In view of this, it is an object of this application to provide an improved method for forming buried power rails, or more generally buried metal lines. More specifically, it is an object of this application to facilitate the formation of buried metal lines with improved, or at least maintained, line resistance, without requiring an increase in the amount of surface area occupied by the substrate. Further and alternative objectives may be understood from the following.

An aspect of the application provides a method for forming a buried metal line in a substrate. The method comprises forming, at a position between a pair of semiconductor structures protruding from the substrate, a metal line trench in the substrate at a level below a base of each semiconductor structure of the pair. Forming the metal line trench comprises etching an upper trench portion in the substrate, forming a spacer on sidewall surfaces of the upper trench portion, the spacer exposing a bottom surface of the upper trench portion, and while the spacer masks the sidewall surfaces of the upper trench portion, etching a lower trench portion via the upper trench portion such that a width of the lower trench portion exceeds a width of the upper trench portion. The method further comprises forming a metal line in the metal line trench.

The method facilitates decoupling an upper trench portion CD from a lower trench portion width, such that a lower trench portion may be widened below the level of the base of the semiconductor structures. In particular, the lower trench portion may be formed with a width exceeding a separation between the pair of semiconductor structures (e.g., a semiconductor fin or pillar spacing). A wider lower trench portion allows for an increased width/cross-section of the metal line. This, in turn, facilitates improving/lowering a line resistance. Further, a wider metal line may provide a greater landing area for a back-side through-silicon via (TSV) contacting approach.

By masking the sidewall surfaces of the upper trench portion with the spacer during the etching of the lower trench portion, the lower trench portion may be widened with a reduced risk of the etching extending into the base portions of the semiconductor structures from below. This contributes to the aforementioned decoupling of the upper trench portion CD and the width of the lower trench portion.

Furthermore, the relaxed CD implied by the wider lower trench portion may facilitate filling the trench with metal during the metal line formation.

The method is applicable to forming buried metal lines in any application where line resistance and/or back-side TSV landing area is of importance. As may be appreciated, the method may be particularly useful for forming a BPR, where line resistance typically is a major design consideration.

As used herein, the term "buried metal line" is used to refer to a metal line structure that is at least partially embedded in the substrate. As will be further set out herein, the metal line may be formed with a height less than a height (i.e., depth) of the metal line trench, where the metal line may be completely embedded/buried in the substrate. The metal line may also be formed with a height exceeding a height of the metal line trench, where the metal line may be partially embedded/buried in the substrate.

The pair of semiconductor structures may be formed by a pair of semiconductor bodies, such as a pair of semiconductor fins (e.g., finFETs) or a pair of horizontal semiconductor nanowire or nanosheet stacks (e.g., horizontal nanowire or nanosheet FETs).

As may be appreciated, the pair of semiconductor structures may comprise a pair of mutually facing sidewall surfaces (i.e., a pair of sidewalls surfaces in a mutually facing relationship), which in the following may be referred to as the pair of mutually facing sidewall surfaces of the pair of semiconductor structures. The pair of mutually facing sidewall surfaces of the pair of semiconductor structures may be formed on mutually opposite sides of the metal line trench to be formed.

Reference may herein be made to a "vertical" direction to denote a direction along a normal to the substrate (i.e., a normal to a main/upper surface of the substrate). Meanwhile, "vertical" qualifiers such as "below" and "above" may be used to refer to relative positions with respect to the vertical direction, and do not necessarily imply an absolute orientation of the substrate. Accordingly, the term "below" may be used to refer to a relative position closer to a main surface of the substrate. The term "above" may be used to refer to a position farther from a main surface of the substrate. For example, a first level or element located below a second level or element implies that the first level or element is closer to the main surface of the substrate than the second level or element. Conversely, a first level or element located above a second level or element implies that the first level or element is farther from the main surface of the substrate than the second level or element.

The term "horizontal" may meanwhile be used to denote a direction or orientation parallel to the substrate (i.e., to a main plane of extension or main surface thereof), or equivalently transverse to the vertical direction. Further, a lateral direction may be understood as a horizontal direction.

The etching of the lower trench portion may comprise a wet etch step. A wet etch step may provide a simultaneous deepening and widening of the trench. As may be understood from the above discussion, the presence of the spacer may counteract etching of the semiconductor structures from below. The spacers may further counteract a widening of the upper trench portion during the isotropic etch step.

The etching of the lower trench portion may further comprise a dry etch step prior to the wet etch step. A "dry" etch step may provide a vertical etching of the substrate, i.e., an etch having a major etch rate component oriented in a thickness direction of the substrate. In a dry etch step, the etching may thus proceed only or at least predominantly in a (downward) vertical direction (i.e., thickness direction) with respect to the substrate. Accordingly, the etching of the lower trench portion may initially proceed predominantly in a thickness direction of the substrate. Thereby, "deepening" the preliminary metal line trench defined by the upper trench portion prior to the widening (and further deepening) wet etching. This may increase an etch margin towards the respective base portions of the semiconductor structures for the subsequent wet etch step.

The etching of the upper trench portion may comprise a dry etch step. Hence, the upper trench portion may proceed predominantly in a thickness direction of the substrate. In an example, the upper trench portion may be formed with a width not exceeding a separation between the pair of semiconductor structures.

Forming the spacer may comprise conformally depositing a spacer layer, and vertically etching the spacer layer to expose the bottom surface of the upper trench portion. A thickness of the spacer may, therefore, be precisely controlled by controlling a thickness of the deposited spacer layer. Owing to the conformal deposition, the spacer layer may be deposited on the sidewall surfaces and the bottom surface of the upper trench portion, and along sidewall surfaces of the pair of semiconductor structures (e.g., along the aforementioned pair of mutually facing sidewall surfaces of the pair of semiconductor structures). Portions of the spacer layer on horizontally oriented surfaces may subsequently be removed by the vertical etch to expose the bottom surface. Portions of the spacer layer on vertically oriented surfaces may remain to form the spacer. The spacer may act as an etch mask during the etching of the lower trench portion, both for the sidewalls of the upper trench portion and for the semiconductor structures.

The method may further comprise, prior to forming the metal line trench, forming an insulating liner on the pair of semiconductor structures, where the insulating liner acts as an etch mask for the semiconductor structures during the etching of the upper trench portion. The liner may, therefore, mask the semiconductor structures during etching of the upper trench portion. The liner may be formed at least on the aforementioned pair of mutually facing sidewall surfaces of the pair of semiconductor structures. The subsequently deposited spacer (or spacer layer) may accordingly be formed on the liner.

The method may further comprise removing the spacer prior to forming the metal line. The full width of the upper trench portion may, therefore, be made available for the subsequent metal line formation.

The method may further comprise, prior to forming the metal line, forming an insulating trench liner in the trench. The metal line may, therefore, be electrically isolated from the semiconductor trench sidewall and bottom surfaces by the trench liner. The trench liner may further be formed along sidewall surfaces of the pair of semiconductor structures (e.g., along the aforementioned pair of mutually facing sidewall surfaces of the pair of semiconductor structures.)

Forming the metal line may comprise depositing metal material to fill the lower trench portion, the upper trench portion, and at least partially a space between the pair of semiconductor structures, and subsequently etching back the deposited metal material to a level at or above the respective base of the pair of semiconductor structures.

Therefore, both the lower and upper trench portions may be used for the metal line. By stopping the etch-back at a level above the semiconductor structure base, a metal line of further improved line resistance may thus be obtained.

The metal line may be formed with a height exceeding a depth of the metal line trench. This may further reduce the line resistance of the metal line.

The metal line formation may comprise depositing a metal line material in the metal line trench, filling at least the lower trench portion, and further filling the upper trench portion, at least partly.

According to some embodiments, forming the metal line may comprise:
  conformally depositing a metal adhesion layer,
  forming a sacrificial layer in the lower trench portion,
  etching back the metal adhesion layer while the sacrificial layer masks the metal adhesion layer in the lower trench portion,
  removing the sacrificial layer to expose a remaining metal adhesion layer portion in the lower trench portion, and
  selectively depositing a metal on the remaining portion of the metal adhesion layer in the lower trench portion.

The lower trench portion may, therefore, be reliably filled with metal. By depositing the metal selectively on the metal adhesion layer (which has been etched back) the risk of "clogging" in the narrower upper trench portion by deposited metal, before obtaining a fill factor of the wider lower trench portion, may be reduced. Especially, the risk of obtaining a metal line with voids in the lower trench portion may be mitigated. The forming of the sacrificial layer allows the metal adhesion layer portions covered by the sacrificial line to be masked, thereby providing accurate control during the metal adhesion layer etch back.

The method may further comprise depositing a metal filling at least in the upper trench portion. The full height/depth of the trench may, therefore, be used for the metal line, to improve line resistance.

The metal may be deposited to at least partially fill a space between the pair of semiconductor structures, and subsequently be etched back to a level at or above the respective base of the semiconductor structures. By stopping the etchback at a level above the semiconductor structure base, a metal line having further improved/reduced line resistance may be obtained.

The method may further comprise, prior to forming the metal line trench:
- embedding the pair of semiconductor structures in an insulating layer, and
- forming a trench opening extending through the insulating layer and exposing the substrate at the position between the pair of semiconductor structures,
- wherein the metal line trench is formed via the trench opening in the insulating layer.

The insulating layer may accordingly, after opening and during the metal line trench formation and metal line formation, cover the substrate in regions where no metal line trenches are to be formed.

The trench opening may extend through the insulating layer and between the pair of semiconductor structures, or more specifically, between the aforementioned pair of mutually facing sidewall surfaces of the pair of semiconductor structures.

In case an insulating liner is formed on the pair of semiconductor structures prior to forming the insulating layer, the trench opening may be formed by etching the insulating layer selectively with respect to the insulating liner.

An etch mask may be formed on the insulating layer, the etch mask defining an opening above the position between the pair of semiconductor structures. The trench opening may subsequently be formed by etching the insulating layer via the mask opening.

According to a further aspect, there is provided a method for forming a buried metal line in a substrate, the method comprising forming, at a position between a pair of semiconductor structures protruding from the substrate, a metal line trench in the substrate at a level below a base of each semiconductor structure of the pair. Forming the metal line trench comprises etching an initial trench in the substrate, forming a sacrificial line in a lower trench portion of the initial trench, forming a spacer on sidewall surfaces of an upper trench portion of the initial trench, above the sacrificial line, the spacer exposing an upper surface of the sacrificial line, removing the sacrificial line, and, while the spacer masks the sidewall surfaces of the upper trench portion, etching the substrate via the lower trench portion to widen the lower trench portion to form a widened lower trench portion of a width exceeding a width of the upper trench portion. The method further comprises forming the metal line in the metal line trench.

This method brings about the same aspects as those discussed in connection with the above aspect. Reference is therefore made to the above.

The etching of the substrate via the lower trench portion to widen the lower trench portion may comprise a wet etch step. As may be understood from the above discussion, the presence of the spacer may counteract etching of the semiconductor structures from below. The spacers may further counteract a widening of the upper trench portion during the isotropic etch step.

The etching of the initial trench may comprise a dry etch step. Hence, the upper trench portion may proceed predominantly in a thickness direction of the substrate. The upper trench portion may, therefore, be formed with a width not exceeding a separation between the pair of semiconductor structures.

Forming the spacer may comprise conformally depositing a spacer layer, and anisotropically etching the spacer layer to expose the upper surface of the sacrificial line.

BRIEF DESCRIPTION OF THE FIGURES

The above, as well as additional objects, features, and advantages of the present disclosure, will be better understood through the following illustrative and non-limiting detailed description, with reference to the appended drawings. In the drawings like reference numerals will be used for like elements unless stated otherwise.

All the figures are schematic, not necessarily to scale, and generally only show parts which are necessary to elucidate example embodiments, wherein other parts may be omitted or merely suggested.

DETAILED DESCRIPTION

Example embodiments for forming a metal line trench and a metal line in the metal line trench will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The figures in the drawings all schematically show, in cross-section, a (preliminary) semiconductor device 100 comprising a substrate 102 and a pair of semiconductor structures formed by a pair of semiconductor fins (hereinafter "fins" 110) protruding from the substrate 102. The following methods will be described in relation to a single pair of fins 110 and for forming a single buried metal line trench. However, as may be appreciated, the method steps may be applied in parallel at a plurality of positions along the substrate to form a buried metal line between a plurality of pairs of fins. It may further be noted that the relative dimensions of the shown structures, for instance, the relative thickness of layers, is merely schematic and may, for the purpose of illustrational clarity, differ from a physical device structure.

The substrate 102 may be a semiconductor substrate, i.e., a substrate comprising at least one semiconductor layer. The substrate 102 may be a single-layered semiconductor substrate, for instance, formed by a bulk substrate. The substrate may, however, also be a multi-layered substrate, for instance, formed by an epitaxially grown semiconductor layer on a bulk substrate, or a semiconductor-on-insulator (SOI) substrate. The substrate 102 may, for instance, comprise a layer of silicon (Si), germanium (Ge) or silicon-germanium (SiGe), or a layer of a different material.

Figure 1A:
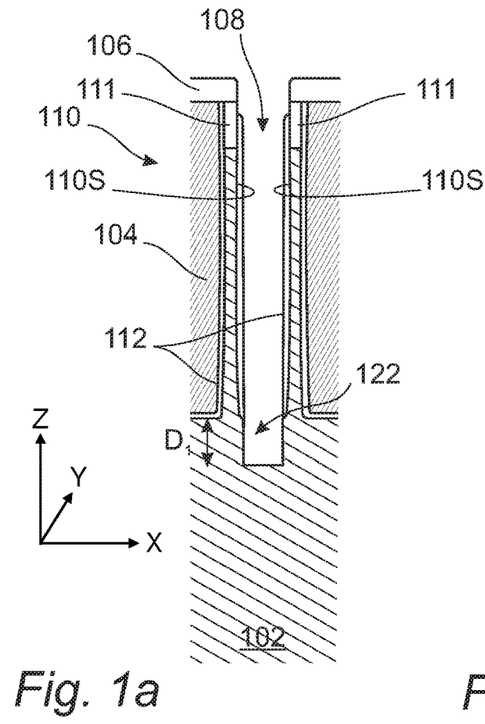
FIGS. 1a-1d illustrate method steps for forming a metal line trench, in accordance with an embodiment.

As indicated in FIG. 1a, the fins 110 protrude in a vertical direction, Z, or equivalently in parallel to a normal direction with respect to the substrate 102. FIG. 1a further indicates first and second mutually perpendicular horizontal directions X and Y, each extending along the substrate 102. The pair of fins 110 are spaced apart along the first horizontal direction X. A longitudinal direction of the fins 110 extends along the second horizontal direction Y. The fins 110 extend in parallel to each other. The pair of fins 110 are formed by a first and a second fin. The first and second fins may define a pair of mutually facing sidewall surfaces 110S. The pair of sidewall surfaces 110S may, as shown, be located on opposite sides of the metal line trench, which is to be formed. The fins 110 may, for example, comprise Si, Ge, or SiGe. The semiconductor structures 110 may be homogenous, single-layered semiconductor bodies, e.g., patterned in a single semiconductor layer of the substrate 102. The fins 110 may be formed on the substrate 102 in a fin patterning process in a conventional manner. The semiconductor fins may be used for forming horizontal channel devices, such as finFETs extending across the fins.

Figure 1B:
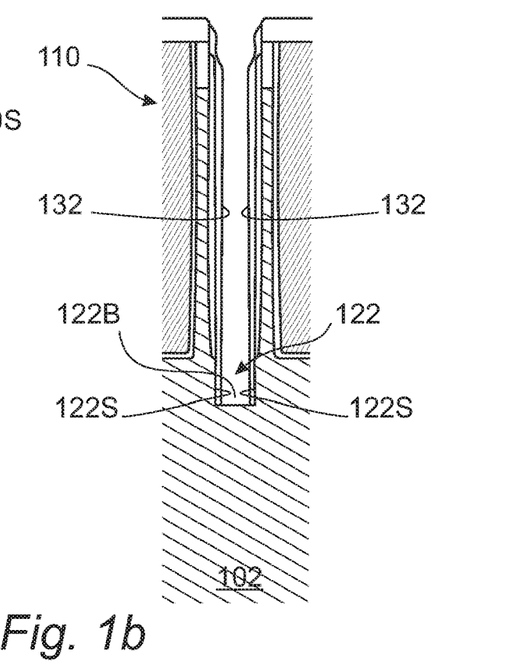
Figure 1C:
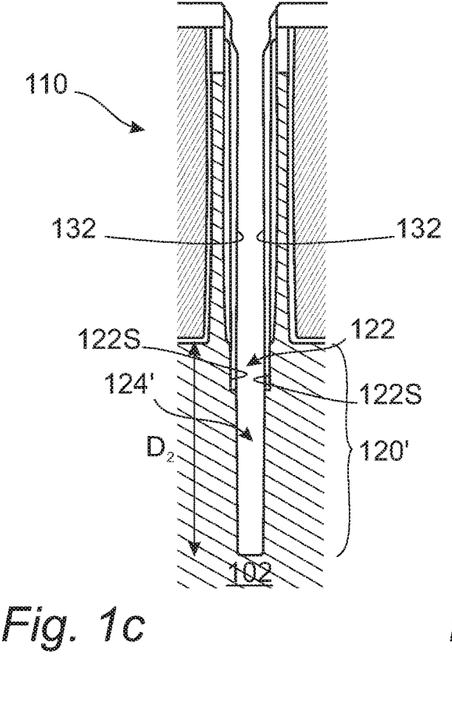
Figure 1D:
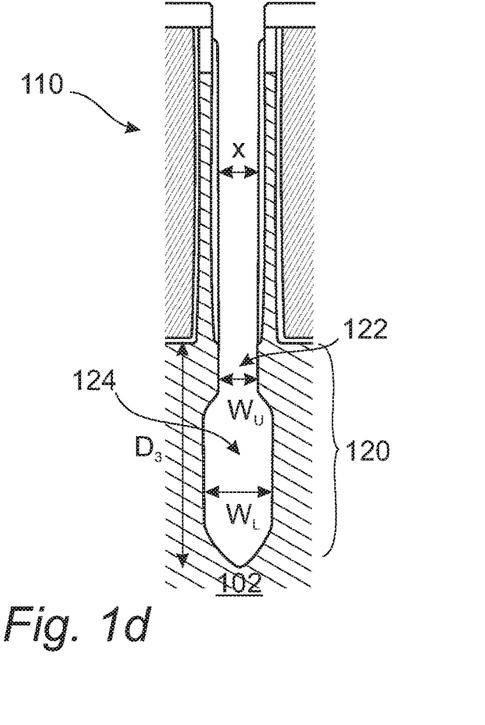

FIGS. 1a-1c illustrate forming a metal line trench 120 at a position between the pair of semiconductor structures, i.e., the fins 110, at a level below a base thereof. In FIG. 1a, an upper trench portion 122 has been etched in the substrate 102 in a vertically oriented dry etch step. In FIGS. 1c and 1d, the substrate 102 has been further etched to form a lower trench portion 124' by a sequence of a further vertically oriented dry etch step followed by a wet etch step, thereby completing formation of the metal line trench 120. The first dry etch step may, as shown in FIG. 1a, be stopped at a first depth $D_1$ in the substrate 102. The further dry etch step may, as shown in FIG. 1c, be stopped at a second depth $D_2 > D_1$ in the substrate 102. The wet etch step may, as shown in FIG. 1d, be stopped at a third depth $D_3 > D_2$, which may define the final depth of the metal line trench 120. Between the steps of etching the upper trench portion 122 and the lower trench portion 124', a spacer 132 has been formed along sidewall surfaces 122S of the upper trench portion 122, shown in FIG. 1b. The spacer 132 may accordingly mask the sidewall surfaces 122S of the upper trench portion 122 during the etching of the lower trench portion 124', thereby counter-acting etching the semiconductor structures 110 from below.

Examples of dry etching (e.g., for the predominantly "vertical" etching steps of the metal line trench formation) include reactive ion etching (ME) and ion beam etching (IBE). Example chemistries include $SF_6$ or $CF_4$ comprising etchants. However, other conventional dry etching chemistries suitable for etching Si and/or Ge-comprising semiconductors are also possible. By orienting the bias field to be directed towards and transverse to the substrate 102, the major etch rate component may be aligned with the thickness direction of the substrate 102 to achieve a vertical and anisotropic etching. It may be noted that a dry etch step may also provide a non-zero lateral (i.e., horizontally oriented) etch rate component. However, since a magnitude of the vertical etch rate component exceeds a magnitude of the lateral etch rate component (typically by one or more orders of magnitude), the etching may still proceed predominantly in the thickness direction of the substrate 102. In an example, a dry etch step is used for the etching of the upper trench portion 122, as well as the etch step applied in FIG. 1c. However, it is envisaged that the etch step for forming the upper trench portion 122 also may be a wet etch step, provided the upper trench portion 122 is formed with a shallow enough depth, i.e., using a short duration etch.

Examples of wet etching (e.g., for the widening etch step applied in FIG. 1d) include KOH, TMAH, and $NH_4OH$ comprising etchants. However, other conventional wet etching chemistries suitable for etching Si and/or Ge-comprising semiconductors are also possible. Wet etching may generally be isotropic, i.e., provide lateral and vertical etch rate components of matching or equal magnitudes. Wet etching may, however, also result in directional etching, i.e., with different etch rates along different crystal directions. However, directional etching of the semiconductor substrate 102 may also involve both lateral and a vertical etch rate components of corresponding magnitudes (typically differing by less than an order of magnitude).

Referring again to FIG. 1a, prior to forming the metal line trench 120, a liner 112 may, as shown, be formed on sidewall surfaces 122S of the fins 110. The liner 112 may be a conformally deposited liner 112, covering an upper surface of the substrate 102 between the fins 110 in addition to the fins 110. The liner 112 may be an insulating liner, for instance, of SiN, SiO2, SiC, SiCO or SiOCN. A nitride or oxide liner 112 may, for example, be deposited by atomic layer deposition (ALD). However, a thermally deposited oxide is also possible for fins of Si.

As further shown, the fins 110 may be embedded in an insulating layer 104. The insulating layer 104 may comprise or be formed of an insulating material, such as a silicon oxide or some other suitable dielectric. Forming the insulating layer 104 may comprise depositing an insulating layer covering the substrate 102 and the fins 110, e.g., by chemical vapor deposition (CVD). The insulating layer 104 may be formed as a planarizing layer. The deposited insulating material may be planarized and reduced in thickness by polishing, e.g., chemical mechanical polishing (CMP), to form the final insulating layer 104. Optionally, the thickness of the insulating layer 104 may be further reduced by an etch-back of the (planarized) upper surface of the insulating layer 104 to bring the upper surface of the insulating layer 104 to a desired level. The insulating layer 104 may be formed to be flush with an upper surface of the fins 110, with the liner 112 covering an upper surface of the fins 110, or as shown in FIG. 1a, with caps 111 on the fins 110. The caps 111 may be formed by respective mask portions (e.g., of a hard mask material) remaining from a fin patterning process.

A trench opening 108 has been formed in the insulating layer 104. The trench opening 108 extends through the insulating layer 104 and exposes the substrate 102 (i.e., an upper surface portion thereof) at the position between the fins 110. The trench opening 108 is formed by etching through an etch mask 106 formed above or on the insulating layer 104. An opening defining the width and longitudinal dimension of the trench opening 108 is formed in the etch mask 106. The etch mask 106 may correspond to a resist-based mask patterned using lithography. However, more complex lithographic layer stacks may also be used, such as spin-on-glass/spin-on-carbon stacks or SiOC/patterning film stacks.

A width of the trench opening 108 (and accordingly a width of the opening in the etch mask 106) may be such that the trench opening 108 extends along the sidewall surfaces 122S of the fins 110. Provided the liner 112 is formed of a material different from the insulating layer 104, the etching of the insulating layer 104 may be selective to the insulating layer 104 such that the liner 112 may act as an etch mask for the fins 110. Thus, the trench opening 108 may expose the liner 112 formed on the sidewall surfaces 122S of the fins 110. In case the liner 112 has been formed to cover also the substrate 102 between the fins 110, the forming of the trench opening 108 may further comprise opening the liner 112 between the fins 110 to expose the upper surface portion of the substrate 102 between fins 110. The liner 112 may be opened using a (vertical) dry etch step.

It is envisaged, however, that the trench opening 108 may be formed with an etch that is non-selective such that the liner 112 is also removed, or alternatively, that no liner 112 has been formed prior to forming the insulating layer 104. In such a case, the trench opening 108 may expose the sidewall surfaces 122S of the fins 110. A liner 112 may subsequently be formed on sidewalls of the trench opening 108, comprising the sidewall surfaces 122S of the fins 110. The liner 112 may be formed by conformally depositing a liner layer. The liner layer may be subsequently opened between the fins 110 to expose the upper surface portion of the substrate 102 between fins 110. The liner layer may be opened using a (vertical) dry etch step.

Subsequent to forming the trench opening 108, the upper trench portion 122 may be etched in the manner set out above, by etching the substrate 102 via the trench opening 108. During the etching of the substrate 102, the liner 112 may act as an etch mask, counteracting etching of the fins 110. As shown in FIG. 1a, the upper trench portion 122 comprises a pair of mutually opposite sidewall surfaces 122S and a bottom surface 122B. The upper trench portion 122 of the metal line trench 120 extends between and along the pair of fins 110.

In FIG. 1b, a spacer 132 has been formed along the sidewall surfaces of 122S of the upper trench portion 122. The spacer 132 exposes the bottom surface 122B of the upper trench portion 122. Forming the spacer 132 may comprise conformally depositing a spacer layer, and subsequently opening the spacer layer at the bottom surface 122B to expose the bottom surface 122B. The liner layer may be opened using a (vertical) dry etch step. The spacer 132 may be formed, for instance, by an oxide or nitride layer, for example, deposited by atomic layer deposition (ALD). Example materials for the spacer 132 include those mentioned in connection with the liner 112. In some examples, the materials for the spacer 132 are different from the liner 112 to allow for later selective removal of the spacer 132. By the dry etch step, the spacer layer may be removed from horizontally oriented surfaces to remain as a (sidewall) spacer 132, e.g., on vertically oriented surfaces. Due to the conformal deposition, the spacer 132 may also form on the sidewalls of the trench opening 108, in particular on the liner 112 on the sidewall surfaces 110S of the fins 110.

In FIG. 1c, the deepened preliminary trench 120' has been formed by further etching back the bottom surface 122B of the upper trench portion 122, e.g., by a dry etch step. During the further etching, the spacer 132 remains on the sidewall surfaces 122S of the upper trench portion as an etch mask. The sidewall surfaces 122S now form upper sidewall surface portions of the preliminary trench 120', above lower sidewall surface portions of the preliminary trench 120'. The spacer 132 covers the upper sidewall surface portions of the sidewall surfaces 122S and exposes the lower sidewall surface portions.

In FIG. 1d, the lower trench portion 124 of the final metal line trench 120 has been formed in a widening (and deepening) etching of the preliminary trench 120', e.g., by a wet etch step. During the etching, the lower sidewall surface portions may be laterally etched back. As may be appreciated, the etching of the lower trench portion 124 may further deepen the trench 120 by an amount corresponding to a width difference between the lower trench portion 124 and upper trench portion 122. The amount of deepening may, however, depend on the relative magnitudes of the lateral and vertical etch rates of the etching. Subsequent to forming the lower trench portion 124, the spacer 132 may be removed, e.g., using a nitride or oxide selective wet etch.

As shown in FIG. 1d, the finished metal line trench 120 comprises an upper trench portion 122 with a width $W_U$ and a lower trench portion 124 with a width $W_L > W_U$. Purely by way of example, for a fin spacing, x, of about 20 nm, the upper trench portion 122 may be etched to a depth $D_1$ of about 20 nm. A width $W_U$ of the upper trench portion 122 may correspond to the fin spacing. The preliminary trench 120' may be etched to a depth $D_2$ of about 100 nm. A width $W_L$ of the lower trench portion 124 may be about 30 nm or greater. A final depth of the trench 120 may be about 110 nm or greater.

Subsequent to forming the metal line trench 120, the metal line 150 may be formed in the metal line trench 120. One or more metals may be deposited to fill the metal line trench 120. In an example, the one or more metals may be deposited to fill the lower trench portion 124 and the upper trench portion 122. Examples of metals for the metal line 150 include Cu, W, Ru, Ni, and Al. The metal(s) may be deposited by deposition techniques such as CVD or ALD. The metal(s) may be deposited with a thickness exceeding a depth of the metal line trench 120, thereby filling, at least partially, a space between the fin 110. The deposited metal(s) may be recessed (e.g., by CMP and/or etch-back) to form a metal line 150 of a desired height, such as meeting or exceeding the depth $D_3$ of the metal line trench 120. The metal line 150 may thereafter be covered by one or more insulating layers, for instance, comprising a line capping layer and an insulating layer (e.g., of a same material as the insulating layer 104).

FIGS. 2a-2d illustrate in more detail one approach for forming the metal line 150.

Figure 2A:
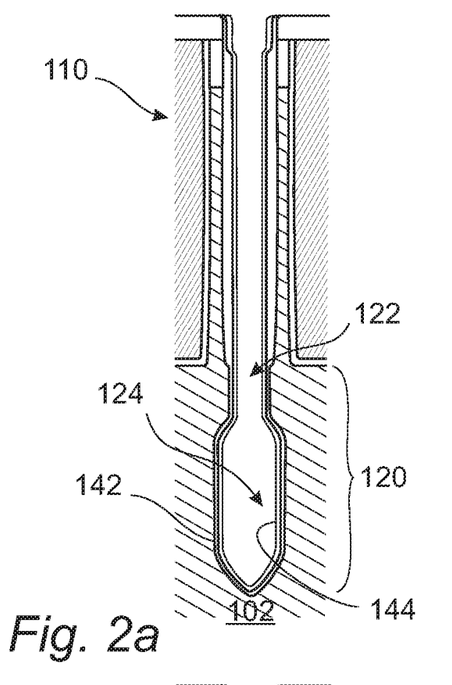
FIGS. 2a-2d illustrate method steps for forming a metal line in the metal line trench, in accordance with an embodiment.

In FIG. 2a, an insulating trench liner 142 has been formed in the trench 120. The trench liner 142 may, for instance, be an ALD oxide or nitride, such as $SiO_2$, SiN, SiCO, SiOCN, or SiCN. A metal adhesion layer 144 has been conformally deposited on the trench liner 142, covering sidewall surfaces of the lower trench portions 124 as well as the upper trench portions 122 (i.e., the "trench walls"). The metal adhesion layer 144 may be a layer of TiN, deposited, for instance, by ALD. A layer of TiN may additionally serve as a metal barrier layer, counteracting metal diffusion into surrounding the semiconductor material. However, the metal adhesion layer 144 may also be formed by any other metal with sufficient adhesion properties, and, if barrier properties are absent, be supplemented by a separate barrier layer underneath. Due to the conformal deposition, the trench walls of the metal line trench 120 may be reliably covered, along with the widened lower trench portion 124 thereof.

Figure 2B:
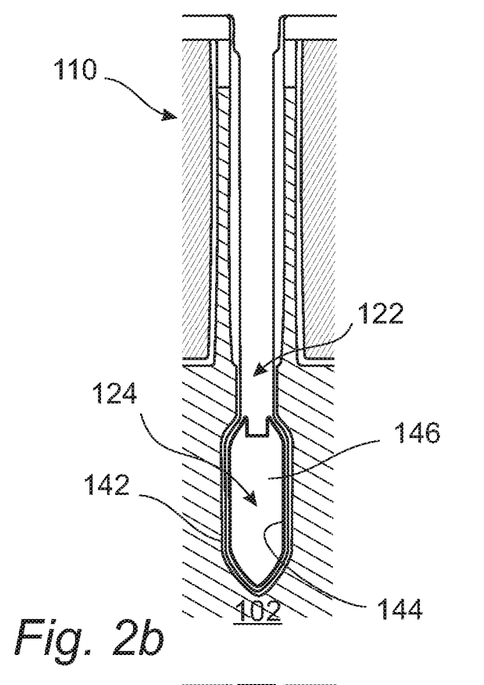

In FIG. 2b, a sacrificial layer 146 has been formed in the lower trench portion 124. The sacrificial layer 146 may be formed by filling the metal line trench 120 with a sacrificial material, such as spin-on-carbon (SOC) or some other spin-on material. The deposited sacrificial material may thereafter be recessed/etched back to form the sacrificial layer 146 of a desired height, such as filling the lower trench portion 124, but not the upper trench portion 122. The sacrificial layer 146 may, therefore, be formed as a sacrificial "line," filling the lower trench portion 124. The sacrificial material may be etched back in a (vertical) dry etch step. After forming the sacrificial layer 146, the metal adhesion layer 144 has been etched back while the sacrificial layer 146 masks the metal adhesion layer 144 in the lower trench portion 124. The portions of the metal adhesion layer 144 outside of the lower trench portion 124 may, therefore, be removed while the portion of the metal adhesion layer 144 in the lower trench portion 124 may be preserved. The metal adhesion layer etch-back may be achieved by a wet etch step, for instance, any suitable wet etch that allows metal (e.g., TiN) to be etched selectively to the sacrificial layer 146 (and the trench liner 142).

Figure 2C:
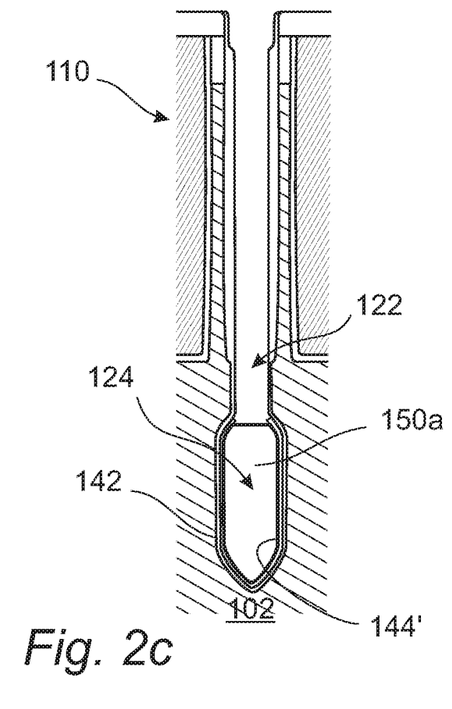

In FIG. 2c, the sacrificial layer 146 has been removed to expose a remaining metal adhesion layer portion 144' in the lower trench portion 124. Suitably, an oxygen or reducing chemistry plasma may be employed. A (first) metal 150a has thereafter been selectively deposited on the remaining metal adhesion layer portion 144' in the lower trench portion 124. The metal 150a may, for example, be W or Ru, which may be selectively deposited by ALD or CVD on the metal adhesion layer 144 while not nucleating on the insulating material (e.g., the oxide or nitride trench liner 142) covering the sidewalls 110S of the fins 110. The metal 150a may be deposited until the lower trench portion 124 is filled, preferably without any voids, at least with a reduced occurrence of voids.

Figure 2D:
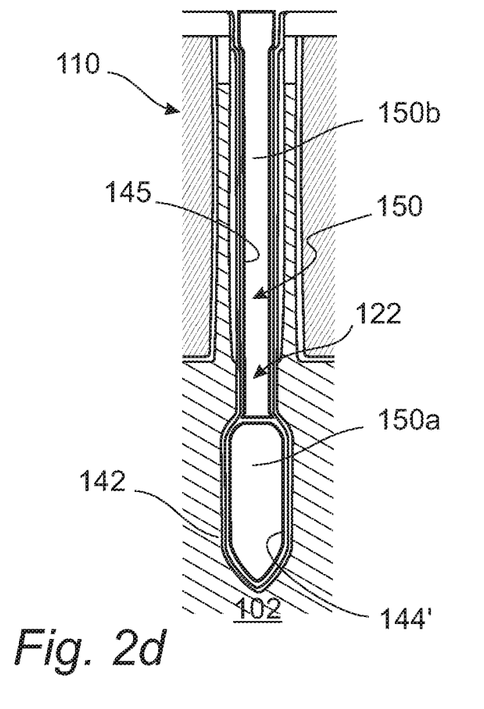

In FIG. 2d, a (second) metal 150b has been deposited over the (first) metal 150a. The metal 150b may, as shown, be deposited to fill at least the upper trench portion 122, but may fill a space between the fins 110. The metal 150b may, for instance, be W or Ru, and may be deposited by CVD or PVD. The deposition of the metal 150b may be preceded by deposition of a metal barrier layer 145, for instance, of a same material as the metal adhesion layer 144. As discussed above, the deposited metal material may be recessed (e.g., by CMP and/or etch-back) to a level at or above the respective base of the pair of semiconductor structures 110, and subsequently be covered by one or more insulating layers.

After the metal line formation, the process may continue with, for example, front-end-of-line processing to form FET devices followed by contact and back-end-of-line processing. For example, further method steps include gate patterning, gate spacer formation, and fin recessing, source/drain formation, and insulating layer deposition to cover the active source/drain regions. The buried metal line 150 may be contacted by etching a contact trench exposing the metal line 150 and filling the contact trench with metal. Additionally, the buried metal line 150 may be contacted by one or more back-side TSVs, formed through the substrate 102.

Figure 3A:
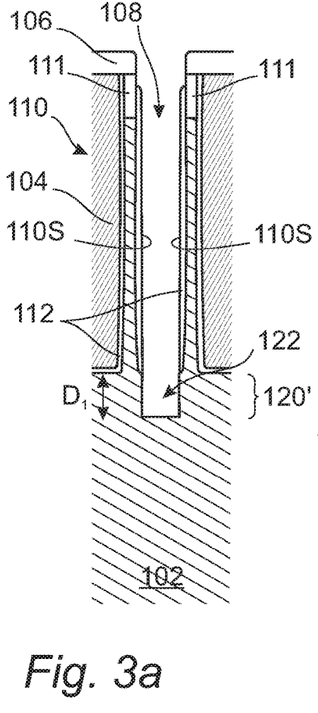
FIGS. 3a-3c illustrate a further method for forming a metal line trench, in accordance with an embodiment.
Figure 3B:
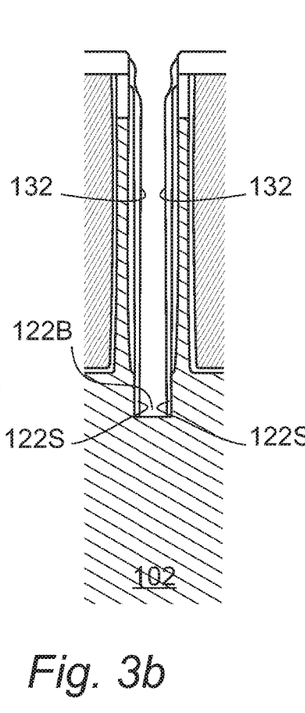
Figure 3C:
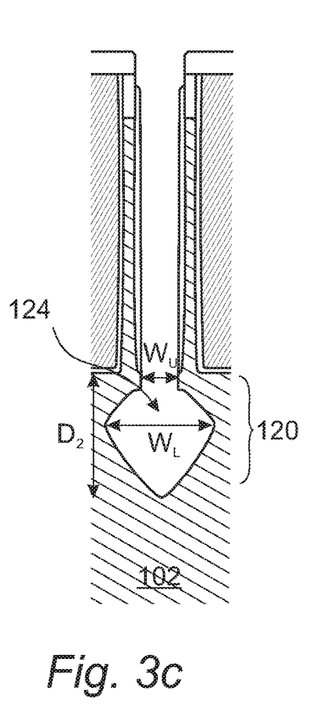

FIGS. 3a and 3b show a variation of a method of forming the metal line trench 150. The method proceeds in a similar manner as outlined in relation to FIGS. 1a-1d. The method, however, differs in that a wet etch step for forming the lower trench portion 124 is applied directly after the dry etch step for forming the upper trench portion 122. Therefore, the widening etch step is not preceded by a further deepening of the preliminary trench. As shown in FIG. 3b, the finished metal line trench 120 comprises an upper trench portion 122 with a width $W_U$ and a lower trench portion 124 with a width $W_L > W_U$. Purely by way of example, for a fin spacing x of about 20 nm, the upper trench portion 122 may be etched to a depth $D_1$ of about 30 nm. A width $W_U$ of the upper trench portion 122 may correspond to the fin spacing. A width $W_L$ of the lower trench portion 124 may be about 40 nm or greater. A final depth of the trench 120 may be about 40 nm or greater. The method may thereafter proceed with formation of the metal line 150 as set out above.

Figure 4A:
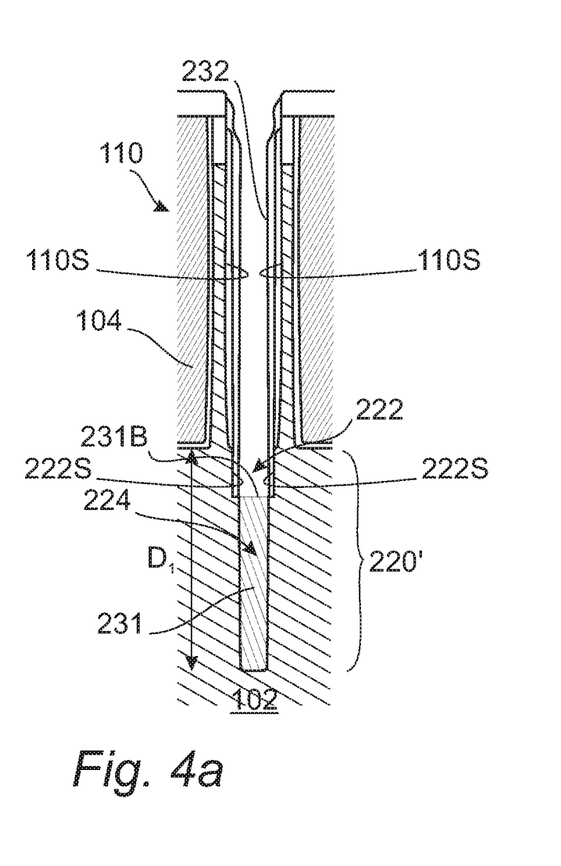
FIGS. 4a-4b illustrate a further method for forming a metal line trench, in accordance with an embodiment.
Figure 4B:
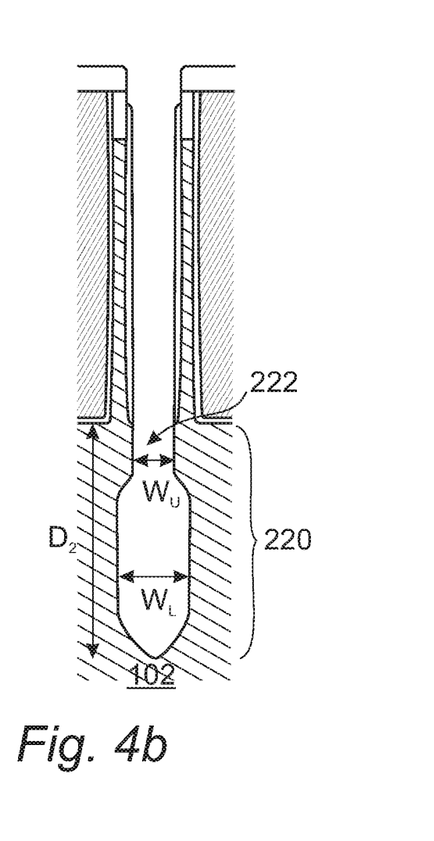

FIGS. 4a and 4b show a further variation of a method of forming a metal line trench 220. The method generally proceeds in a similar manner as outlined in relation to the above. However, the method differs in the sequence of steps applied immediately prior and subsequent to the forming of the spacer 132. More specifically, the method comprises etching an initial trench 220' in the substrate 102, e.g., by a dry etch step. Compared to the method shown in FIGS. 1a-1d, the initial trench 220' may be formed with a greater depth than the upper trench portion 122, such as a depth $D_1$ of about 100 nm.

Subsequently, a sacrificial layer or "line" 231 is formed in a lower trench portion 224' of the initial trench 220'. The sacrificial line 231 may be formed by filling the metal line trench 220 with a sacrificial material, such as spin-on-carbon (SOC) or some other spin-on material. The deposited sacrificial material may thereafter be recessed to form the sacrificial line 231 of a desired height, such as filling the lower trench portion 224', but not an upper trench portion 222 of the initial trench 220'. The sacrificial material may be etched back in an anisotropic etch step.

Subsequently, a spacer 232 is formed on sidewall surfaces of 222S of the upper trench portion 222 of the initial trench 220', above the sacrificial line 231. The spacer 232 exposes an upper surface 231B of the sacrificial line 231. The spacer 232 may be formed in a similar manner as the spacer 132, as discussed above.

In FIG. 4b, the sacrificial line 231 has been removed, thus exposing the sidewall surfaces 222S of the lower trench portion 224. While the spacer 232 masks the sidewall surfaces 222S of the upper trench portion 222, a wet etch step may be applied via the lower trench portion 224' to widen the lower trench portion 224' to form a widened (and possibly deepened) lower trench portion 224 of a width $W_L$ exceeding a width $W_u$ of the upper trench portion 222. The method may thereafter proceed with formation of the metal line 150 as set out above.

In the above, the methods have been disclosed with reference to semiconductor structures in the form of fins. However, the methods are also applicable for forming a buried metal line between a pair of semiconductor structures in the form of a pair of horizontal semiconductor nanowire or nanosheet stacks. A nanowire or nanosheet stack may, for example, comprise alternatingly arranged layers of Si and SiGe, or SiGe-layers of different compositions, or Si or SiGe layers separated by an insulating layer. Stacks of horizontal nanowires and nanosheets may be used for forming horizontal channel devices, such as horizontal gate-all-around FETs, i.e., with gates wrapping around the horizontally oriented channel structures.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for forming a buried metal line in a substrate, the method comprising:
   forming, at a position between a pair of semiconductor structures protruding from the substrate, a metal line trench in the substrate at a level below a base of each semiconductor structure of the pair, wherein forming the metal line trench comprises:
   etching an upper trench portion in the substrate;
   forming a spacer on sidewall surfaces of the upper trench portion, wherein the spacer exposes a bottom surface of the upper trench portion;
   while the spacer masks the sidewall surfaces of the upper trench portion, etching a lower trench portion by etching the substrate via the upper trench portion such that a width of the lower trench portion exceeds a width of the upper trench portion;

conformally depositing a metal adhesion layer;
forming a sacrificial layer in the lower trench portion;
etching back the metal adhesion layer while the sacrificial layer masks the metal adhesion layer in the lower trench portion;
removing the sacrificial layer to expose a remaining metal adhesion layer portion in the lower trench portion; and
selectively depositing a metal on the remaining portion of the metal adhesion layer in the lower trench portion to thereby form the metal line in the metal line trench.

2. The method according to claim 1, wherein the etching of the lower trench portion comprises a wet etch step.

3. The method according to claim 2, wherein the etching of the lower trench portion further comprises a dry etch step prior to the wet etch step.

4. The method according to claim 3, wherein the etching of the upper trench portion comprises a dry etch step.

5. The method according to claim 4, wherein forming the spacer comprises conformally depositing a spacer layer, and vertically etching the spacer layer to expose the bottom surface of the upper trench portion.

6. The method according to claim 5, further comprising, prior to forming the metal line trench, forming an insulating liner on the pair of semiconductor structures, wherein the insulating liner acts as an etch mask for the semiconductor structures during the etching of the upper trench portion.

7. The method according to claim 6, further comprising, prior to forming the metal line trench:
embedding the pair of semiconductor structures in an insulating layer; and
forming a trench opening that extends through the insulating layer, which exposes the substrate at the position between the pair of semiconductor structures,
wherein the metal line trench is formed via the trench opening in the insulating layer.

8. The method according to claim 7, further comprising removing the spacer prior to forming the metal line.

9. The method according to claim 8, further comprising, prior to forming the metal line, forming an insulating trench liner in the trench.

10. The method according to claim 9, wherein forming the metal line comprises:
depositing metal material in the lower trench portion to thereby fill the lower trench portion, the upper trench portion and at least partially a space between the pair of semiconductor structures with the metal material, and
subsequently etching back the deposited metal material to a level at or above the respective base of the pair of semiconductor structures.

11. The method according to claim 1, further comprising, prior to forming the metal line trench, forming an insulating liner on the pair of semiconductor structures, wherein the insulating liner acts as an etch mask for the semiconductor structures during the etching of the upper trench portion.

12. The method according to claim 1, further comprising, prior to forming the metal line trench:
embedding the pair of semiconductor structures in an insulating layer; and
forming a trench opening that extends through the insulating layer, which exposes the substrate at the position between the pair of semiconductor structures,
wherein the metal line trench is formed via the trench opening in the insulating layer.

13. The method according to claim 1, further comprising removing the spacer prior to forming the metal line.

14. The method according to claim 1, further comprising, prior to forming the metal line, forming an insulating trench liner in the trench.

15. The method according to claim 1, wherein forming the metal line comprises:
depositing metal material in the lower trench portion to thereby fill the lower trench portion, the upper trench portion and at least partially a space between the pair of semiconductor structures with the metal material, and
subsequently etching back the deposited metal material to a level at or above the respective base of the pair of semiconductor structures.

16. The method according to claim 1, wherein the metal line is formed with a height exceeding a depth of the metal line trench.

17. The method according to claim 1, further comprising:
depositing a metal filling in at least the upper trench portion.

18. The method according to claim 1, wherein the buried metal line forms a buried power rail.

19. The method according to claim 1, wherein the pair of semiconductor structures are formed by a pair of semiconductor fins or a pair of horizontal semiconductor nanowire or nanosheet stacks.

20. A method for forming a buried metal line in a substrate, the method comprising:
forming, at a position between a pair of semiconductor structures protruding from the substrate, a metal line trench in the substrate at a level below a base of each semiconductor structure of the pair, wherein forming the metal line trench comprises:
etching an initial trench in the substrate;
forming a sacrificial line in a lower trench portion of the initial trench;
forming a spacer on sidewall surfaces of an upper trench portion of the initial trench, above the sacrificial line, the spacer exposing an upper surface of the sacrificial line;
removing the sacrificial line; and
while the spacer masks the sidewall surfaces of the upper trench portion, etching the substrate via the lower trench portion to widen the lower trench portion to form a widened lower trench portion of a width exceeding a width of the upper trench portion; and
forming the metal line in the metal line trench.

* * * * *